(12) United States Patent
Alexander et al.

(10) Patent No.: US 6,809,978 B2
(45) Date of Patent: Oct. 26, 2004

(54) IMPLEMENTATION OF A TEMPERATURE SENSOR TO CONTROL INTERNAL CHIP VOLTAGES

(75) Inventors: George William Alexander, Durham, NC (US); Steven Michael Baker, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 198 days.

(21) Appl. No.: 10/144,597

(22) Filed: May 13, 2002

(65) Prior Publication Data

US 2003/0210598 A1 Nov. 13, 2003

(51) Int. Cl.[7] .................................................. G11C 7/04
(52) U.S. Cl. ....................... 365/211; 365/212; 365/149; 365/189.07
(58) Field of Search ................................ 365/211, 212, 365/149, 189.07

(56) References Cited

U.S. PATENT DOCUMENTS 5,278,796 A  *  1/1994  Tillinghast et al. ......... 365/211
5,784,328 A  *  7/1998  Irrinki et al. ................ 365/222
5,873,053 A  *  2/1999  Pricer et al. ................. 702/130
5,994,752 A     11/1999  Sander et al.
6,255,892 B1    7/2001  Gartner et al.
6,373,768 B2 *  4/2002  Woo et al. ................... 365/211
6,453,218 B1 *  9/2002  Vergis ........................ 700/299
6,504,697 B1    1/2003  Hille

FOREIGN PATENT DOCUMENTS

EP          0314084 B1    12/1994

OTHER PUBLICATIONS

U.S. patent application Ser. No. 10/144,572, Partsch et al., filed May 13, 2002.
U.S. patent application Ser. No. 10/144,579, Edmonds et al., filed May 13, 2002.

* cited by examiner

*Primary Examiner*—Connie C. Yoha
(74) *Attorney, Agent, or Firm*—Brinks Hofer Gilson & Lione

(57) ABSTRACT

A method of regulating a voltage of an internal voltage generator of an integrated circuit that includes sensing a temperature of an integrated circuit, comparing the sensed temperature with a voltage of a network of the integrated circuit and regulating a voltage of an internal voltage generator of the integrated circuit based on the comparing.

9 Claims, 6 Drawing Sheets

IMPLEMENTATION OF A TEMPERATURE SENSOR TO CONTROL INTERNAL CHIP VOLTAGES

BACKGROUND OF THE INVENTION

1. Field of the Invention

The present invention relates to the field of semiconductor integrated circuits in general and semiconductor integrated memory chips in particular.

2. Discussion of Related Art

A known semiconductor integrated circuit, such as a semiconductor integrated memory IC 100 that is a writeable memory of the DRAM type, is shown in FIG. 1. Such a dynamic random access memory (DRAM) chip 100 includes a plurality of memory storage cells 102 in which each cell 102 has a transistor 104 and an intrinsic capacitor 106 as shown in FIG. 4. The memory storage cells 102 are arranged in arrays 108 as shown in FIGS. 2 and 3, wherein the memory storage cells 102 in each array 108 are interconnected to one another via columns of conductors 110 and rows of conductors 112. The transistors 104 are used to charge and discharge the capacitors 106 to certain voltage levels. The capacitors 106 then store the voltages as binary bits, 1 or 0, representative of the voltage levels. The binary 1 is referred to as a "high" and the binary 0 is referred to as a "low." The voltage value of the information stored in the capacitor 106 of a corresponding memory storage cell 102 is called the logic state of the memory storage cell 102.

As shown in FIGS. 1 and 2, the memory chip 100 includes six address input contact pins A0, A1, A2, A3, A4, A5 along its edges that are used for both the row and column addresses of the memory storage cells 102. The row address strobe (RAS) input pin receives a signal RAS that clocks the address present on the DRAM address pins A0 to A5 into the row address latches 114. Similarly, a column address strobe (CAS) input pin receives a signal CAS that clocks the address present on the DRAM address pins A0 to A5 into the column address latches 116. The memory chip 100 has a data pin Din that receives data and a data pin Dout that sends data out of the memory chip 100. The memory chip 100 has a pin Vss that receives an external voltage of 5 V. The modes of operation of the memory chip 100, such as Read, Write and Refresh, are well known and so there is no need to discuss them for the purpose of describing the present invention.

A variation of a semiconductor integrated circuit or a DRAM chip is shown in FIGS. 5 and 6. In particular, by adding a synchronous interface between the basic core DRAM operation/circuitry of a second generation DRAM and the control coming from off-chip, a synchronous dynamic random access memory (SDRAM) chip 200 is formed. The SDRAM chip 200 includes a bank of memory arrays 208 wherein each array 208 includes memory storage cells 210 interconnected to one another via columns and rows of conductors.

As shown in FIGS. 5 and 6, the memory chip 200 includes twelve address input contact pins A0–A11 that are used for both the row and column addresses of the memory storage cells of the bank of memory arrays 208. The row address strobe (RAS) input pin receives a signal RAS that clocks the address present on the DRAM address pins A0 to A11 into the bank of row address latches 214. Similarly, a column address strobe (CAS) input pin receives a signal CAS that clocks the address present on the DRAM address pins A0 to A11 into the bank of column address latches 216. The memory chip 200 has data input/output pins DQ0–15 that receive and send input signals and output signals. The input signals are relayed from the pins DQ0–15 to a data input register 218 and then to a DQM processing component 220 that includes DQM mask logic and write drivers for storing the input data in the bank of memory arrays 208. The output signals are received from a data output register 222 that received the signals from the DQM processing component 220 that includes read data latches for reading the output data out of the bank of memory arrays 208. The memory chip 200 has a pin Vss that is approximately at ground and a pin $V_{DD}$ that receives an external voltage of 3.3 V. The modes of operation of the memory chip 200, such as Read, Write and Refresh, are well known and so there is no need to discuss them for the purpose of describing the present invention.

A variation of the SDRAM memory chip 200 discussed above is a so-called DDR DRAM memory chip that registers commands and operations on the rising edge of the clock signal while data is transferred on both rising and falling edges of the clock signal. In such a DDR DRAM memory chip, the external voltage received by pin $V_{DD}$ is approximately 2.5V.

It is noted that new generations of DRAM, SDRAM and DDR DRAM chips are being designed where the magnitude of the externally and internally generated voltages are being reduced so that power and heat are reduced. With the reduction in the externally generated voltages, there is a need to maintain the internal voltages at their present levels as current loads change and thus increase reliance on such internally generated voltages. With such increased reliance on internally generated voltages, the deleterious effect, on the internally generated voltages based on the temperature of and the effect of the heat of the memory chip due to such factors as current flow and environment, increases.

SUMMARY OF THE INVENTION

One aspect of the present invention regards a voltage control system for an integrated circuit that includes an integrated circuit having an internal voltage generator and a network and a temperature sensor that is positioned so as to sense a temperature of the integrated circuit and generates a signal representative of the sensed temperature. A comparator connected to the temperature sensor and the network so as to receive the signal representative of the sensed temperature and a voltage of the network, wherein the comparator generates a regulating signal that is used to regulate a voltage of the internal voltage generator. A control system is connected to the integrated circuit and the comparator, wherein the control system receives the regulating signal and regulates the voltage of the internal voltage generator based on the regulating signal.

A second aspect of the present invention regards a method of regulating a voltage of an internal voltage generator of an integrated circuit that includes sensing a temperature of an integrated circuit, comparing the sensed temperature with a voltage of a network of the integrated circuit and regulating a voltage of an internal voltage generator of the integrated circuit based on the comparing.

Each of the above aspects of the present invention provides the advantage of compensating the voltages of internal voltage generators of a memory chip for temperature.

Each of the above aspects of the present invention provides the advantage of allowing external voltages supplied to an integrated circuit to be reduced and preventing a substantial decrease in current due to such reduction of external voltages.

The present invention, together with attendant objects and advantages, will be best understood with reference to the detailed description below in connection with the attached drawings.

DETAILED DESCRIPTION OF THE INVENTION

Figure 1:
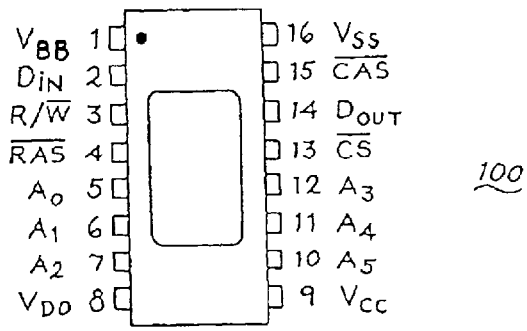
FIG. 1 schematically shows a top view of an embodiment of a known memory chip.
Figure 2:
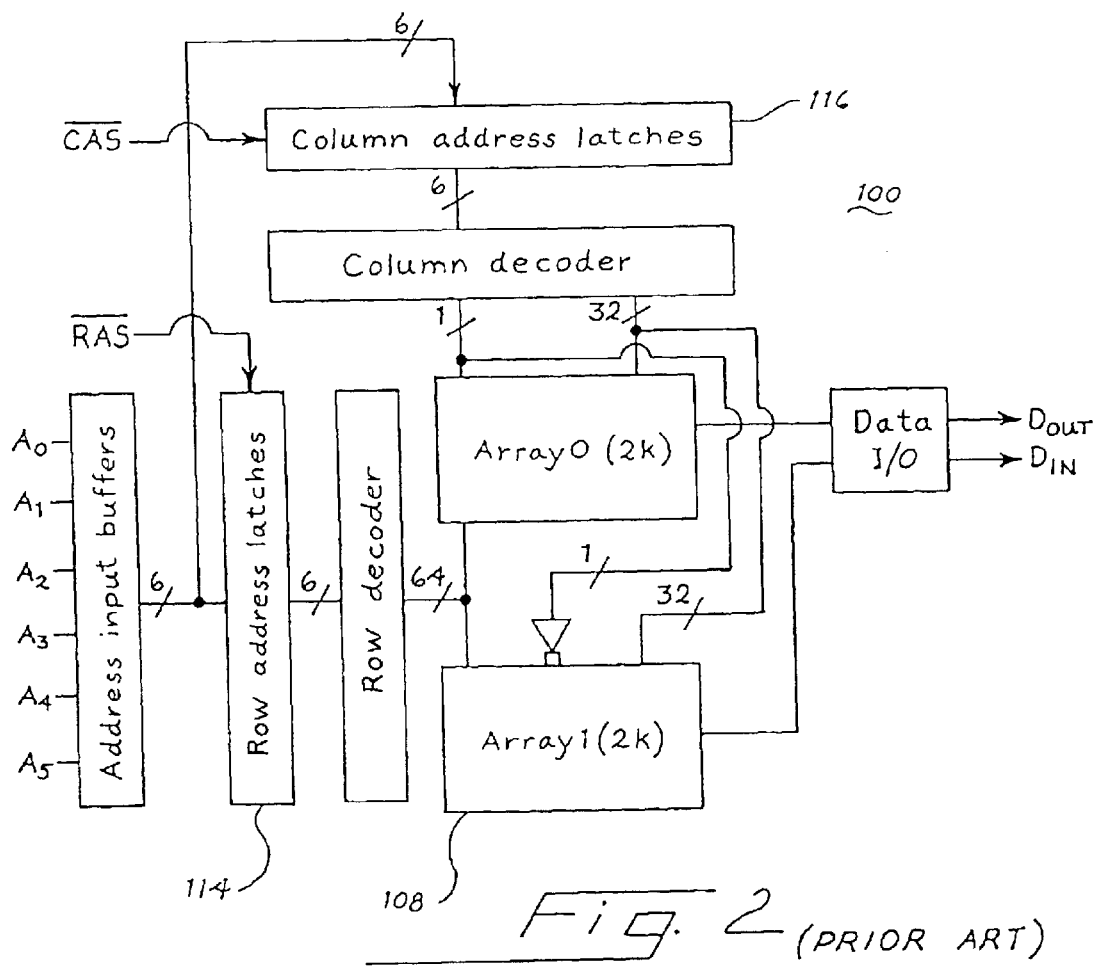
FIG. 2 shows a block diagram of the memory chip of FIG. 1.
Figure 3:
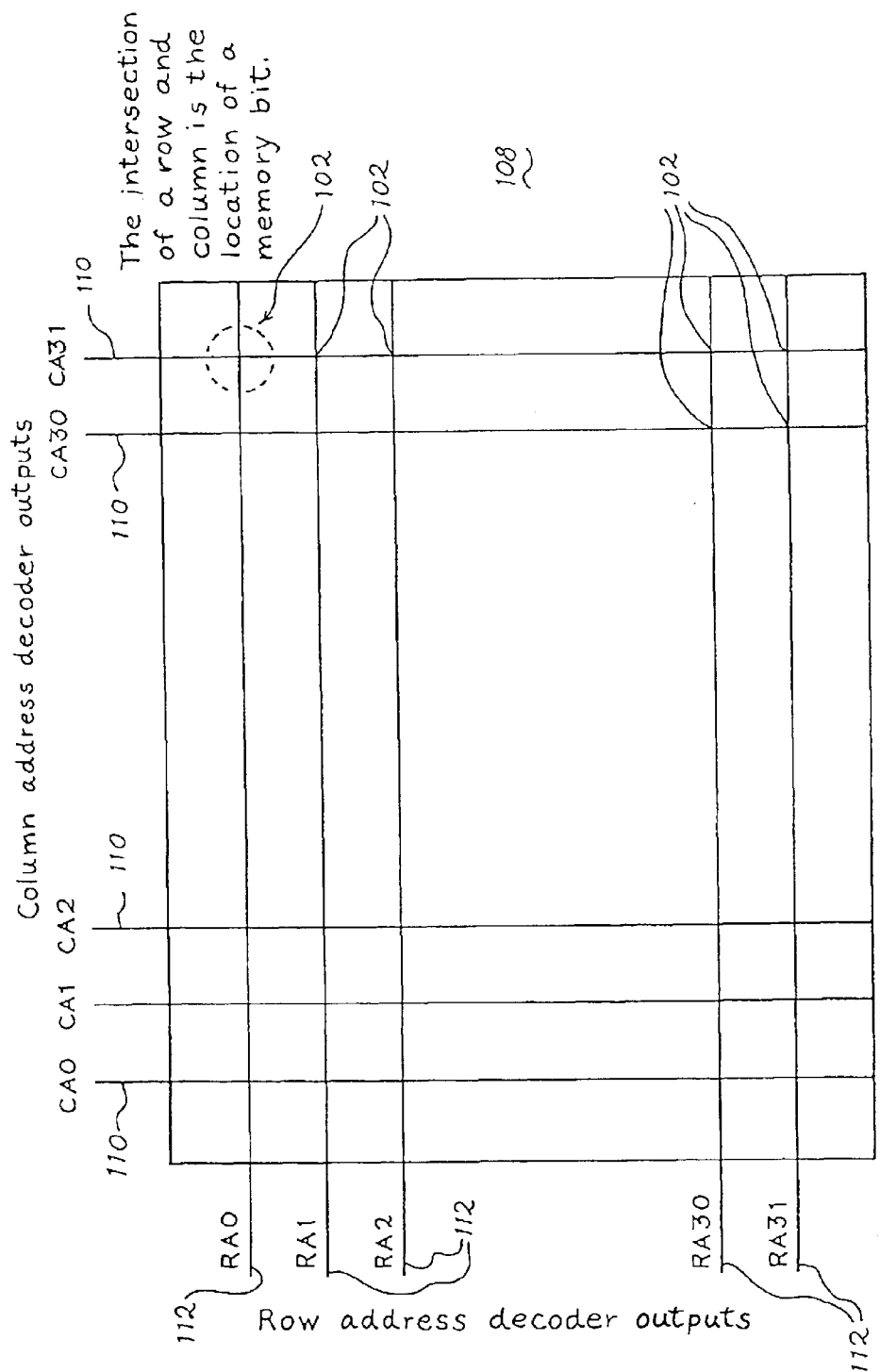
FIG. 3 schematically shows an embodiment of a memory array to be used with the memory chip of FIG. 1.
Figure 4:
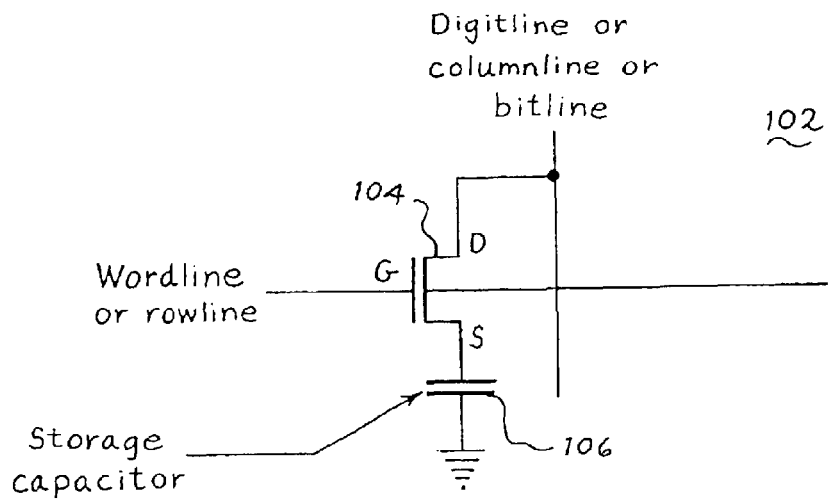
FIG. 4 schematically shows an embodiment of a memory cell to be used with the memory array of FIG. 3.
Figure 5:
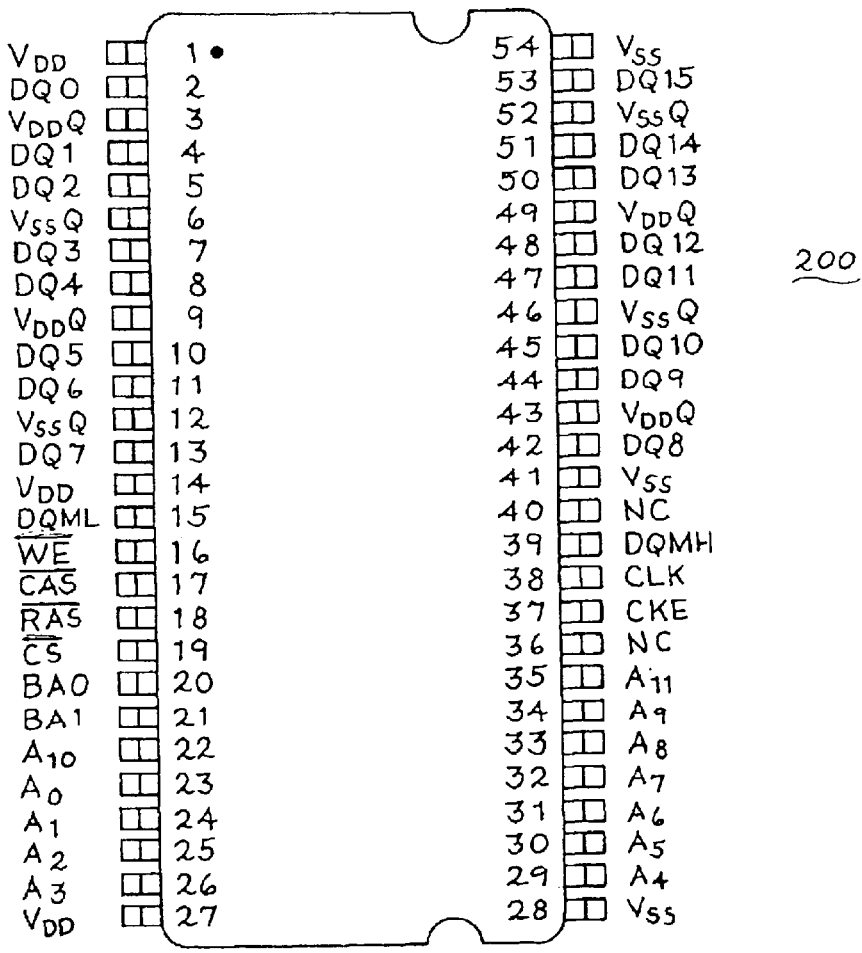
FIG. 5 schematically shows a top view of a second embodiment of a known memory chip.
Figure 6:
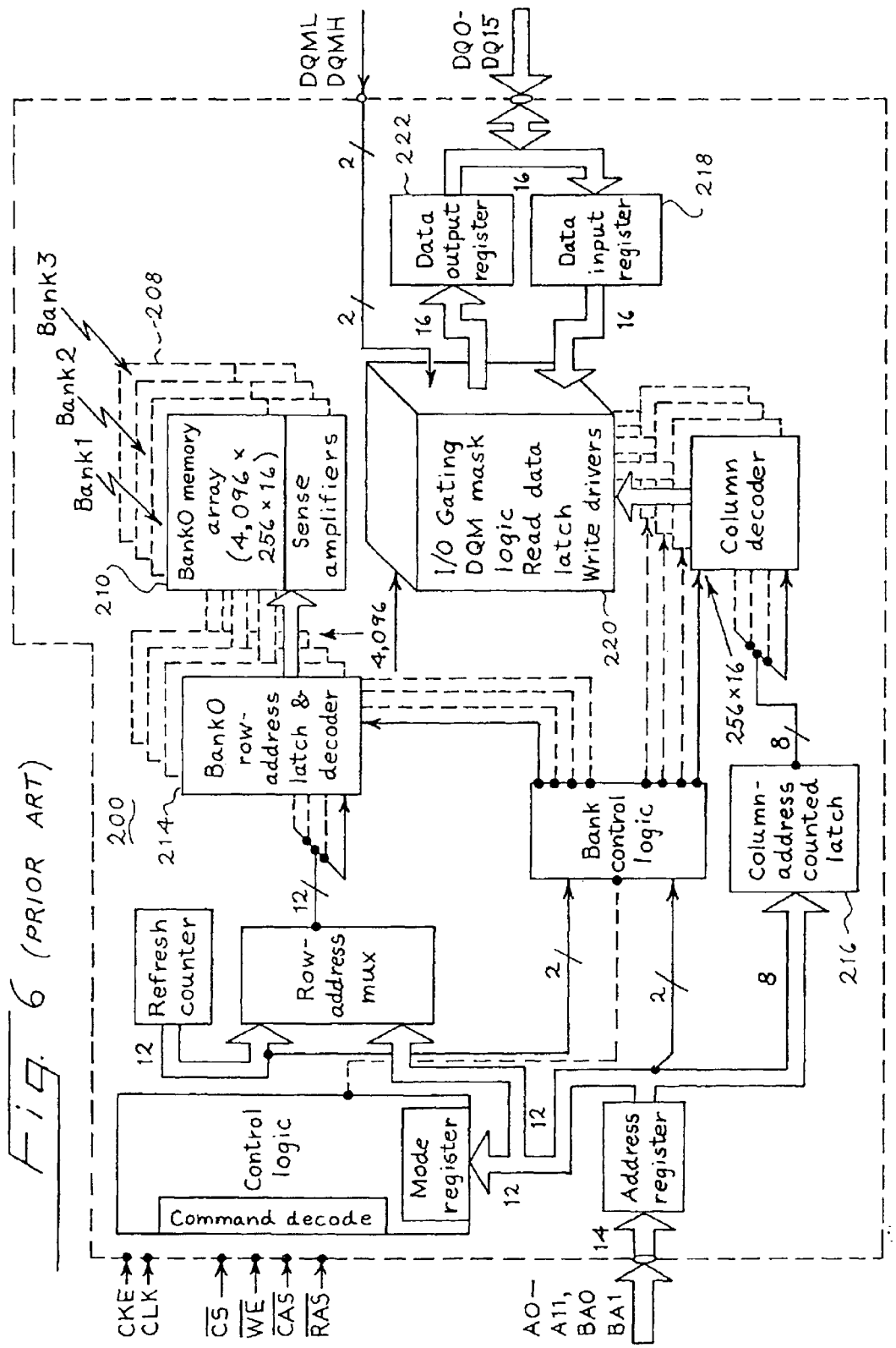
FIG. 6 shows a block diagram of the memory chip of FIG. 5.
Figure 7:
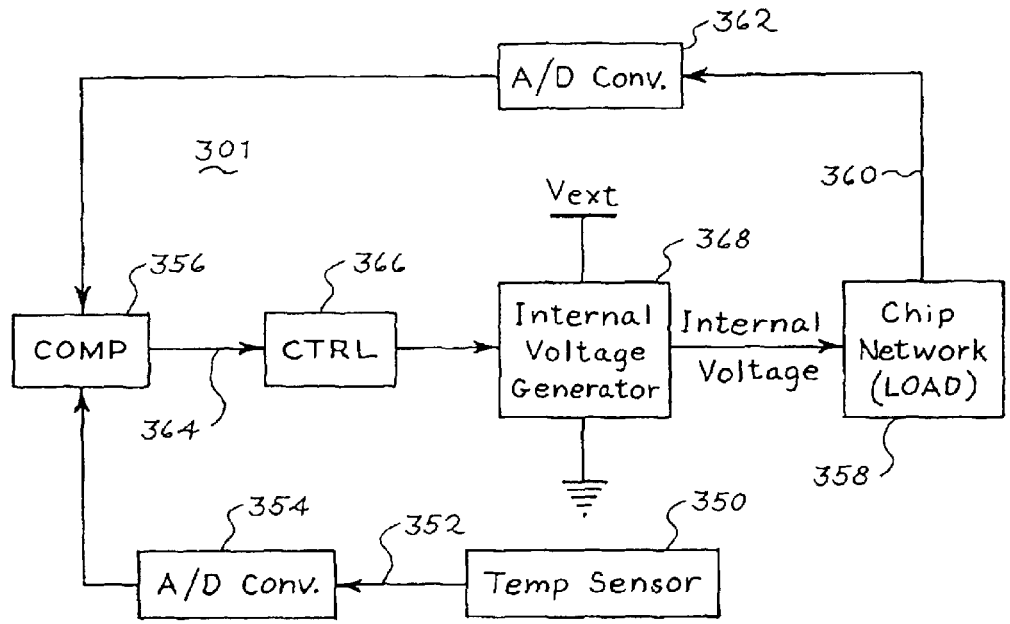
FIG. 7 shows a block diagram of an embodiment of a voltage control system for a memory according to the present invention.

As shown in FIG. 7, a voltage control system 301 according to the present invention includes either of the semiconductor integrated circuit memory chips 100, 200 described previously with respect to FIGS. 1–6 or the DDR DRAM memory chip described previously. It should be noted that the present invention could be used with other types of memory chips or other semiconductor networks using internal voltage generators, such as SDRAMs and DDR DRAMs.

As shown in FIG. 7, the voltage control system 301 further includes a temperature sensor 350 attached to the die of the memory chip 100, 200 and is centrally positioned on the memory chip 100, 200 and may be connected to a power bus so as to sense a real time temperature of the memory chip 100, 200. Note that a variety of known sensors, such as a wheatstone bridge, would be acceptable for the temperature sensor 350. The temperature sensor 350 generates an analog signal 352, $T_{analogreal}$, representative of the sensed real time temperature and the signal 352, $T_{analogreal}$, is sent to an analog-to-digital converter 354 where it is digitized. The signal $T_{digitalreal}$ of the sensed real time temperature is then sent to a comparator 356.

Figure 9:
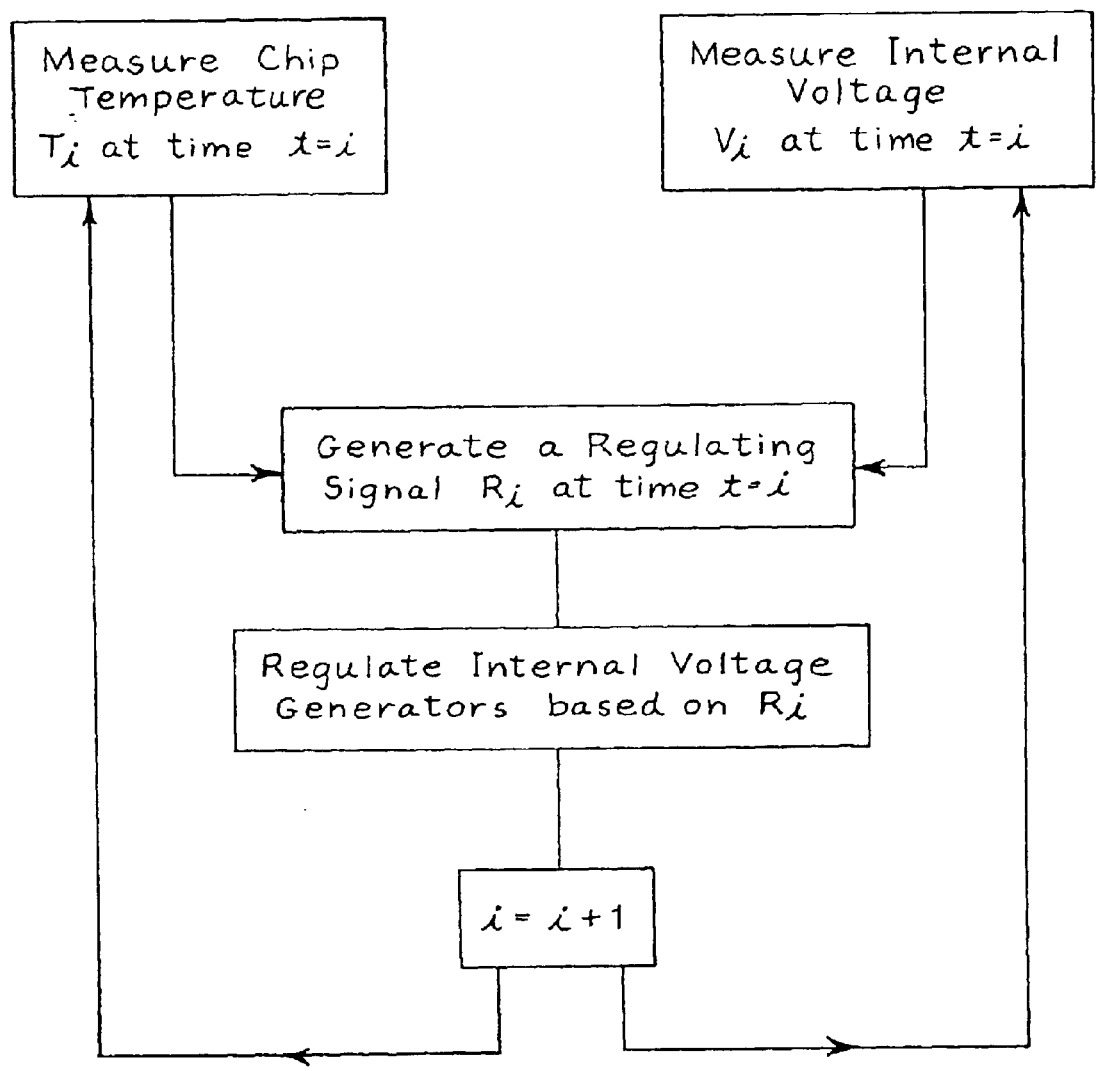
FIG. 9 shows an embodiment of a method of controlling a voltage control system according to the present invention.

The voltage control system 301 also monitors the real time voltage applied to an internal chip network or load 358 of the memory chip 100, 200. A voltage $V_{analogreal}$ corresponding to a real time voltage of the network or load 358 is sent to an analog-to-digital converter 362 where it is digitized. The digital signal $V_{digitalreal}$ corresponding to the real time voltage of the network or load 358 is then sent to the comparator 356. As shown in FIGS. 7 and 9, the comparator 356 compares the signals $T_{digitalreal}$ and $V_{digitalreal}$ and generates a signal 364 that is used to regulate the internally generated voltages.

As shown in FIGS. 7 and 9, the signal 364 is sent to a control system 366 that is connected to the memory chip 100, 200. The control system 366 adjusts the voltage generated by the internal voltage generator 368 based on the signal 366. In particular, based on signal 364 the control system 366 changes the input to the internal voltage generator 368 so that the internal voltage generator 368 generates a voltage such that the chip network 358 does not see a change in the level of power being supplied to it by the internal voltage generator 368. It is believed that as the temperature increases and external voltage decreases, there will be a need to increase the output of the internal voltage generators to maintain the power level. Ideally no change in power will be encountered by the chip network 358 despite changes in temperature as long as the rest of the system reacts fast enough to the changes in temperature.

Figure 8:
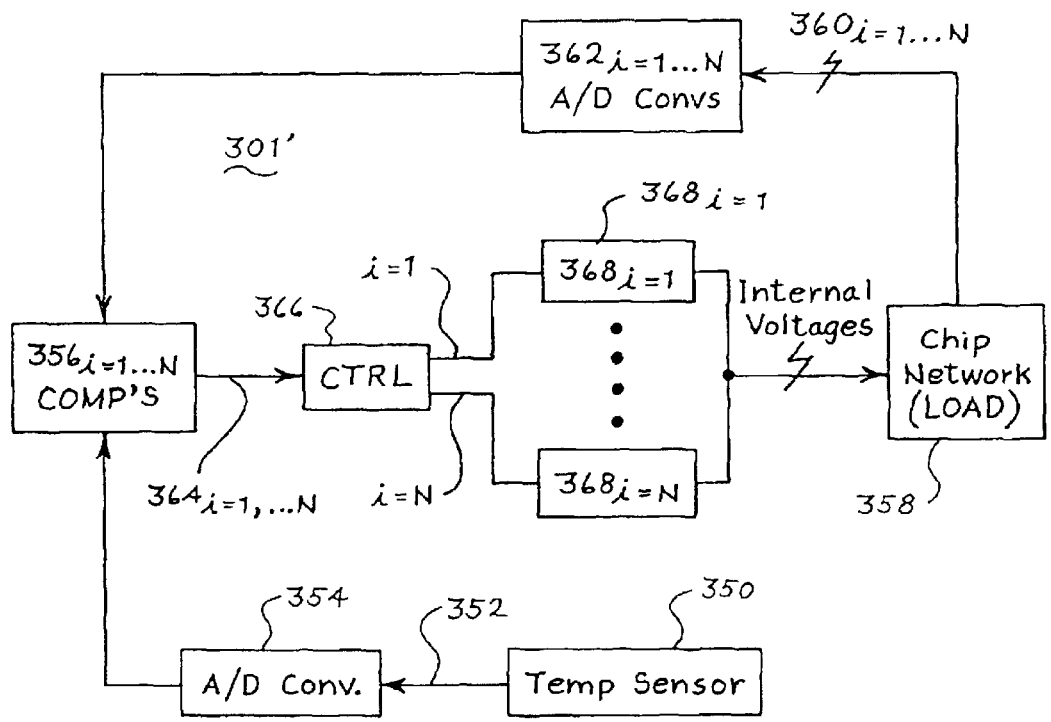
FIG. 8 shows a block diagram of a second embodiment of a voltage control system for a memory according to the present invention.

Note that in an alternative embodiment shown in FIG. 8, a multiple number, N, of internal voltage generators $368_{i=1,\ldots,N}$ generate corresponding voltages that are applied to the chip network 358. The voltage control system 301' monitors the real time voltages applied to the internal chip network or load 358 by the voltage generators $368_{i=1,\ldots,N}$. Multiple analog signals $V_{analogreal\ i=1,\ldots,N}$ corresponding to the real time voltages applied by generators $368_{i=1,\ldots,N}$ are sent to corresponding analog-to-digital converters $362_{i=1,\ldots,N}$ where they are digitized and then sent to corresponding comparators $356_{i=1,\ldots,N}$. As shown in FIGS. 8 and 9, the comparators $356_{i=1,\ldots,N}$ compare the signal $T_{digitalreal}$ with the signals $V_{digitalreal\ i=1,\ldots,N}$ and generate corresponding signals $364_{i=1,\ldots,N}$.

As shown in FIGS. 8 and 9, the signals $364_{i=1,\ldots,N}$ are sent to a control system 366 that is connected to the memory chip 100, 200. The control system 366 adjusts the voltages generated by the internal voltage generators $368_{i=1,\ldots,N}$ based on the corresponding signals $364_{i=1,\ldots,N}$ in a manner similar to that described previously with respect to the embodiment of FIG. 7.

The foregoing description is provided to illustrate the invention, and is not to be construed as a limitation. Numerous additions, substitutions and other changes can be made to the invention without departing from its scope as set forth in the appended claims.

We claim:

1. A voltage control system for controlling the internal supply voltage of an integrated circuit, comprising:

a controllable internal voltage source integrated in the integrated circuit for generating the controlled internal supply voltage of the integrated circuit based on an external voltage $V_{ext}$ and for supplying the controlled internal supply voltage to a chip network of the integrated circuit;

a temperature sensor that is positioned so as to sense a temperature of said integrated circuit and generates a signal representative of said sensed temperature;

a comparator connected to said temperature sensor and said chin network so as to receive said signal representative of said sensed temperature and a voltage of said chip network and so as to generate a regulating signal based on a comparison of the signal representing the temperature and the voltage of the chip network; and a control system that is connected to said comparator, wherein said control system receives said regulating signal and regulates said voltage of said controllable internal voltage source based on said regulating signal.

2. The voltage control system of claim 1, wherein said temperature sensor is attached to said integrated circuit.

3. The voltage control system of claim 1, wherein said regulating signal is determined so that said network does not encounter a change in a level of power being supplied to it by said internal voltage generator.

4. The voltage control system of claim 1, wherein said integrated circuit is a memory chip.

5. The voltage control system of claim 4, wherein said memory chip comprises a DRAM memory.

6. A method of regulating a voltage of an internal voltage generator of an integrated circuit, comprising:

sensing a temperature of an integrated circuit;

comparing said sensed temperature with a voltage of a network of said integrated circuit; and regulating a voltage of an internal voltage generator of said integrated circuit based on said comparing.

7. The method of claim 6, wherein said voltage of said internal voltage generator is regulated so that said network does not encounter a change in a level of power being supplied to it by said internal voltage generator.

8. The method of claim 6, wherein said integrated circuit is a memory chip.

9. The method of claim 8, wherein said memory chip comprises a DRAM memory.

* * * * *